United States Patent
Miyazawa et al.

(10) Patent No.: US 8,820,898 B2
(45) Date of Patent: Sep. 2, 2014

(54) DROPLET-EJECTING HEAD, DROPLET-EJECTING APPARATUS, AND PIEZOELECTRIC ELEMENT

(75) Inventors: Hiromu Miyazawa, Azumino (JP); Koichi Morozumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 793 days.

(21) Appl. No.: 12/891,950

(22) Filed: Sep. 28, 2010

(65) Prior Publication Data

US 2011/0074890 A1 Mar. 31, 2011

(30) Foreign Application Priority Data

Sep. 30, 2009 (JP) .................................. 2009-227124

(51) Int. Cl.
  *B41J 2/045* (2006.01)
  *H01L 41/083* (2006.01)
  *C04B 35/491* (2006.01)
  *B41J 2/14* (2006.01)
  *H01L 41/187* (2006.01)

(52) U.S. Cl.
  CPC ......... *B41J 2/14233* (2013.01); *H01L 41/1876* (2013.01); *C04B 35/491* (2013.01)
  USPC ........................................... 347/72; 310/358

(58) Field of Classification Search
  None
  See application file for complete search history.

(56) References Cited

U.S. PATENT DOCUMENTS

| 2005/0128675 A1 | 6/2005 | Wang et al. |
| 2008/0203856 A1 | 8/2008 | Miyazawa |
| 2008/0224571 A1* | 9/2008 | Miyazawa et al. ............ 310/358 |
| 2008/0239017 A1 | 10/2008 | Takabe et al. |

FOREIGN PATENT DOCUMENTS

| EP | 2 104 153 | 9/2009 |
| JP | 2001-223404 | 8/2001 |
| JP | 2008-258575 | 10/2008 |

* cited by examiner

*Primary Examiner* — Jerry Rahll
(74) *Attorney, Agent, or Firm* — Workman Nydegger

(57) ABSTRACT

A droplet-ejecting head including a substrate including a pressure chamber communicating with a nozzle hole and also a piezoelectric element that includes a lower electrode, a piezoelectric layer which is formed above the lower electrode, and an upper electrode formed above the piezoelectric element and that causes a change in pressure in a liquid contained in the pressure chamber. The piezoelectric layer includes a first piezoelectric sub-layer located on the lower electrode and a second piezoelectric sub-layer located between the first piezoelectric sub-layer and the upper electrode. The first piezoelectric sub-layer has a polarization axis predominantly directed in an in-plane direction of the first piezoelectric sub-layer. The second piezoelectric sub-layer is predominantly (100)-oriented in the pseudocubic coordinate system.

16 Claims, 11 Drawing Sheets

DROPLET-EJECTING HEAD, DROPLET-EJECTING APPARATUS, AND PIEZOELECTRIC ELEMENT

The entire disclosure of Japanese Patent Application No. 2009-227124, filed Sep. 30, 2009 is expressly incorporated herein by reference.

BACKGROUND OF THE INVENTION

1. Technical Field

The present invention relates to a droplet-ejecting head, a droplet-ejecting apparatus, and a piezoelectric element. More particularly, the present invention relates to a droplet-ejecting head, apparatus, and piezoelectric element with improved ejection characteristics.

2. Related Art

Many ink jet processes and techniques for high-definition high-speed printing are currently used in the art. One commonly used technique using a piezoelectric actuator including electrodes and a piezoelectric layer sandwiched therebetween is useful in ejecting ink droplets. Typically, the material for forming the piezoelectric layer is lead zirconate titanate ($Pb(Zr,Ti)O_3$, PZT), which is a perovskite-type oxide, as disclosed in, for example, JP-A-2001-223404.

Piezoelectric actuators for use in droplet-ejecting apparatuses such as ink jet printers need to have an increased displacement so as to eject larger droplets or such that they may be operated at lower voltage. This issue is not limited to the piezoelectric actuators but is common to piezoelectric elements for use in other apparatuses, including ultrasonic motors, pressure sensors, and ultrasonic devices such as ultrasonic oscillators.

BRIEF SUMMARY OF THE INVENTION

An advantage of some aspects of the invention is to provide a droplet-ejecting head having good displacement characteristics, resulting in superior ejection properties. Other aspects of the invention provide a droplet-ejecting apparatus including the droplet-ejecting head and an piezoelectric element for use in the droplet-ejecting head or in the droplet-ejecting apparatus.

A first aspect of the invention is a droplet-ejecting head which includes a substrate including a pressure chamber communicating with a nozzle hole and a piezoelectric element that includes a lower electrode, a piezoelectric layer which overlies the lower electrode and which is made of perovskite-type oxide, and an upper electrode overlying the piezoelectric element and that causes a change in pressure in a liquid contained in the pressure chamber. The piezoelectric layer includes a first piezoelectric sub-layer located on the lower electrode and a second piezoelectric sub-layer located between the first piezoelectric sub-layer and the upper electrode. The first piezoelectric sub-layer has a polarization axis predominantly directed in an in-plane direction of the first piezoelectric sub-layer. The second piezoelectric sub-layer is predominantly (100)-oriented in the pseudocubic coordinate system.

In the droplet-ejecting head, the polarization axis of the first piezoelectric sub-layer is predominantly directed in an in-plane direction of the first piezoelectric sub-layer and the second piezoelectric sub-layer is predominantly (100)-oriented in the pseudocubic coordinate system. This allows the droplet-ejecting head to have good displacement properties.

A second aspect of the invention is a piezoelectric element which includes a lower electrode, a piezoelectric layer which overlies the lower electrode and which is made of perovskite-type oxide, and an upper electrode overlying the piezoelectric element. The piezoelectric layer includes a first piezoelectric sub-layer located on the lower electrode and a second piezoelectric sub-layer located between the first piezoelectric sub-layer and the upper electrode. The first piezoelectric sub-layer has a polarization axis predominantly directed in an in-plane direction of the first piezoelectric sub-layer. The second piezoelectric sub-layer is predominantly (100)-oriented in the pseudocubic coordinate system.

In the piezoelectric element, the polarization axis of the first piezoelectric sub-layer is predominantly directed in an in-plane direction of the first piezoelectric sub-layer and the second piezoelectric sub-layer is predominantly (100)-oriented in the pseudocubic coordinate system. This allows the piezoelectric element to have good piezoelectric properties.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the present invention will now be described with reference to the accompanying drawings.

In the description below, the term "an in-plane direction of the first piezoelectric sub-layer" refers to a direction in which crystal grains in the first piezoelectric sub-layer are grown, that is, a direction perpendicular to or substantially perpendicular to the thickness direction of the first piezoelectric sub-layer. The phrase "the polarization axis of the first piezoelectric sub-layer is predominantly directed in an in-plane direction of the first piezoelectric sub-layer" as used herein means that, in half or more (50% or more) of the area of the first piezoelectric sub-layer in an in-plane direction, the polarization axis is directed in the in-plane direction.

The term "pseudocubic" as used herein means that a crystal structure is almost cubic.

The term "predominantly (100)-oriented" as used herein covers the case where all of crystal grains are (100)-oriented and also covers the case where most of crystal grains (for example, 90% or more) are (100)-oriented and other crystal grains that are not (100)-oriented are (111)- or (110)-oriented.

In descriptions herein, the term "overlie" is used in, for example, the phrase "a specific thing (hereinafter referred to as "B") overlying another specific thing (hereinafter referred to as "A"). This phrase covers the phrase "B lying on A" and the phrase "B lying above A with another thing present therebetween."

The phrase "a crystal structure is a monoclinic structure" as used herein covers the case where all of crystal grains have a monoclinic structure in addition to the case where most of the crystal grains (for example, 90% or more) have a monoclinic structure and other crystal grains having no monoclinic structure have a tetragonal structure.

The term "lattice constant" as used herein refers to the length of a side of a unit cell with a perovskite-type structure represented by the formula $ABO_3$.

First Embodiment

Figure 1:
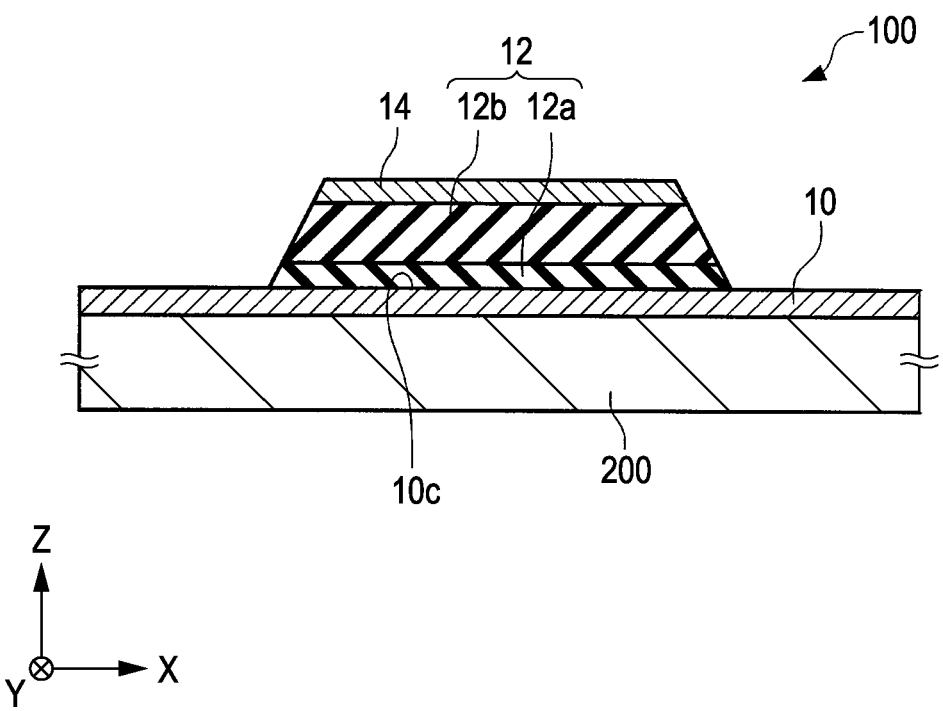
FIG. 1 is a schematic sectional view of a piezoelectric element according to a first embodiment of the present invention.

A piezoelectric element 100 according to a first embodiment of the present invention will now be described. FIG. 1 is a schematic sectional view of the piezoelectric element 100.

With reference to FIG. 1, the piezoelectric element 100 includes a base 200, a lower electrode 10 disposed on the base 200, a piezoelectric layer 12 which is disposed on the lower electrode 10 and which contains perovskite-type oxides, and an upper electrode 14 disposed on the piezoelectric layer 12. The base 200 may take various forms depending on applications of the piezoelectric element 100.

The piezoelectric layer 12 includes a first piezoelectric sub-layer 12a disposed on the lower electrode 10 and a second piezoelectric sub-layer 12b disposed between the first piezoelectric sub-layer 12a and the upper electrode 14. The first piezoelectric sub-layer 12a may have a tetragonal structure. The second piezoelectric sub-layer 12b may have a monoclinic structure. The first and second piezoelectric sub-layers 12a and 12b are predominantly (100)-oriented in the pseudocubic coordinate system. For example, 90% or more of crystal grains in the second piezoelectric sub-layer 12b are (100)-oriented in the pseudocubic coordinate system.

Examples of a perovskite-type oxide for forming the first piezoelectric sub-layer 12a include lead titanate and a lead titanate solid solution. Lead titanate and the lead titanate solid solution may contain a small amount of an element for forming the second piezoelectric sub-layer 12b (for example, 10% or less in a B site). Examples of such an element include zirconium and niobium. Lead titanate has a tetragonal structure.

The first piezoelectric sub-layer 12a has a thickness of, for example, 1 nm to 20 nm. When the thickness of the first piezoelectric sub-layer 12a is less than 1 nm, the first piezoelectric sub-layer 12a is poor in controlling the orientation of the second piezoelectric sub-layer 12b. When the thickness of the first piezoelectric sub-layer 12a is greater than 20 nm, the first piezoelectric sub-layer 12a is likely to have poor piezoelectric properties.

Examples of a perovskite-type oxide for forming the second piezoelectric sub-layer 12b include lead zirconate titanate ($Pb(Zr,Ti)O_3$, PZT) and a lead zirconate titanate solid solution. An example of the lead zirconate titanate solid solution is lead zirconate titanate niobate ($Pb(Zr,Ti,Nb)O_3$, PZTN). Lead zirconate titanate or the lead zirconate titanate solid solution may contain a larger amount of lead as compared to the above formulas. The number of moles of lead contained in lead zirconate titanate or the lead zirconate titanate solid solution may be 1.0 to 130 when the number of moles of zirconium and titanium contained in lead zirconate titanate or the lead zirconate titanate solid solution is one. Half of lead atoms exceeding 1.0 in the composition of the second piezoelectric sub-layer 12b occupy B sites of a perovskite-type structure represented by the formula $ABO_3$. The term "B site" as used herein refers to a site coordinated by six oxygen atoms. This is described in JP-A-2008-258575 in detail. Similarly, half of lead atoms exceeding 1.0 in the composition of the first piezoelectric sub-layer 12a can occupy B sites of a perovskite-type structure represented by the formula $ABO_3$. The fact that an excessive amount of lead is present at a B site of a perovskite-type structure has been verified with an energy dispersive X-ray fluorescence spectrometer (EDX) by transmission electron microscopy (TEM).

When the second piezoelectric sub-layer 12b is made of, for example, lead zirconate titanate ($Pb(Zr_xTi_{1-x})O_3$), x is preferably 0.4 to 0.6 and more preferably 0.45 to 0.55. When x is within the above range, the second piezoelectric sub-layer 12b can be readily controlled so as to have a monoclinic structure. However, the crystal structure of the second piezoelectric sub-layer 12b does not solely depend on the value of x but depend on factors such as stress, lattice defect, and dislocation. In this embodiment, the second piezoelectric sub-layer 12b has a monoclinic structure as is clear from an example below.

The thickness of the second piezoelectric sub-layer 12b is not particularly limited and may be, for example, 300 nm to 1,500 nm.

The lower electrode 10 is one for applying a voltage to the piezoelectric layer 12. The lower electrode 10 may include, for example, a polycrystalline platinum (Pt) layer and a polycrystalline iridium (Ir) layer disposed thereon. The Ir layer may be converted into an iridium oxide layer through a step of firing a precursor of the piezoelectric layer 12. The thickness of the lower electrode 10 is not particularly limited and may be 50 nm to 200 nm.

The upper electrode 14 applies a voltage to the piezoelectric layer 12. The upper electrode 14 may include an iridium (Ir) layer. The thickness of the upper electrode 14 is not particularly limited and may be 50 nm to 200 nm.

Figure 2:
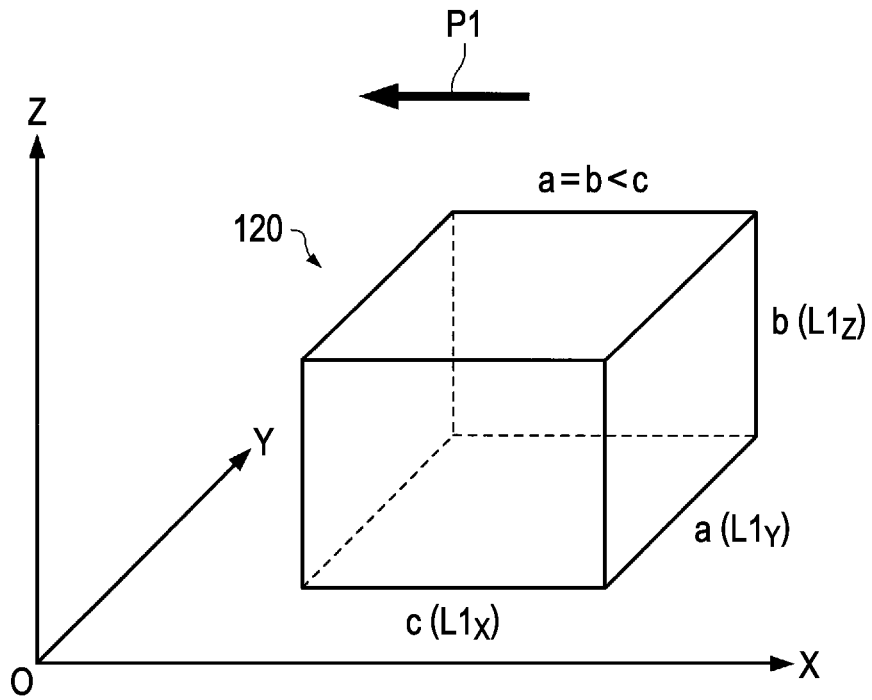
FIG. 2 is a schematic view illustrating the crystal structure of a first piezoelectric sub-layer included in the piezoelectric element.
Figure 3:
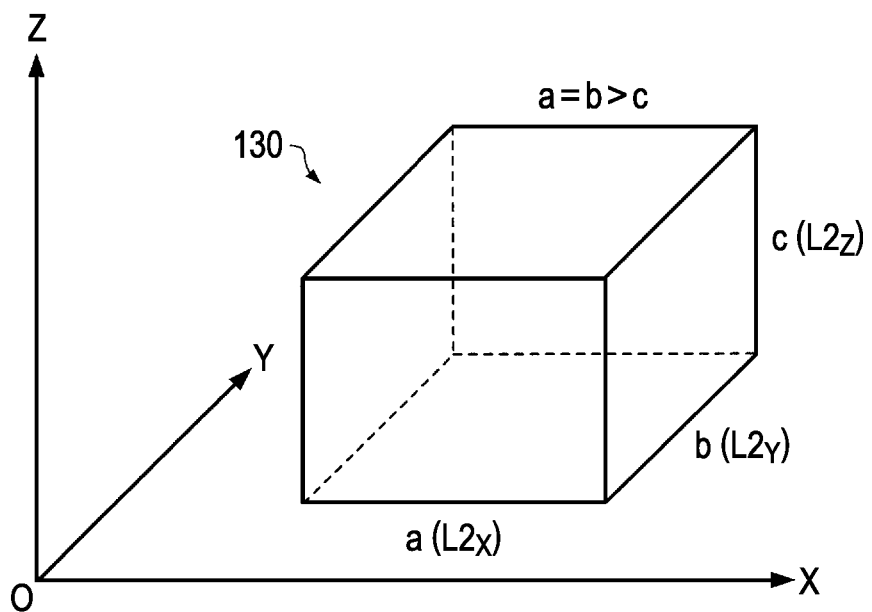
FIG. 3 is a schematic view illustrating the crystal structure of a second piezoelectric sub-layer included in the piezoelectric element.

The crystal structure of the piezoelectric layer 12 is described below with reference to FIGS. 1 to 3. FIG. 2 is a schematic view illustrating the crystal structure of the first piezoelectric sub-layer 12a. FIG. 3 is a schematic view illustrating the crystal structure of the second piezoelectric sub-layer 12b.

As shown in FIG. 2, a crystal 120 in the first piezoelectric sub-layer 12a has a lattice constant $a(L1_Y)$ in a first direction (Y-direction shown in FIGS. 1 and 2) that is one of in-plane directions of the first piezoelectric sub-layer 12a and a lattice constant $b(L1_Z)$ in the thickness direction (Z-direction shown in FIGS. 1 and 2) of the first piezoelectric sub-layer 12a, the lattice constant $a(L1_Y)$ being equal to or substantially equal to the lattice constant $b(L1_Z)$. The in-plane directions of the first piezoelectric sub-layer 12a are parallel to the upper surface 10c of the lower electrode 10 as shown in FIG. 1. The thickness direction of the first piezoelectric sub-layer 12a is perpendicular to the upper surface 10c of the lower electrode 10 as shown in FIG. 1. The crystal 120 also has a lattice constant $c(L1_X)$ in a second direction (X-direction) that is one of the in-plane directions of the first piezoelectric sub-layer 12a, the lattice constant $c(L1_Y)$ being greater than the lattice constant $b(L1_Z)$ in the second direction (Y-direction) perpendicular to the first direction in the pseudocubic coordinate system. The relationship between these constants is represented by the following formula:

$$a(L1_Y)=b(L1_Z)<c(L1_X).$$

This formula expresses that the first piezoelectric sub-layer 12a has a tetragonal structure with a c-axis parallel to an in-plane direction thereof.

As shown in FIG. 3, a crystal 130 in the second piezoelectric sub-layer 12b has a lattice constant $a(L2_Y)$ in an in-plane direction (X-direction shown in FIGS. 1 and 2) of the second piezoelectric sub-layer 12b, a lattice constant $b(L2_Y)$ in an in-plane direction (Y-direction shown in FIGS. 1 and 2) of the second piezoelectric sub-layer 12b, and a lattice constant $c(L2_Z)$ in the thickness direction (Z-direction shown in FIGS. 1 and 3) of the second piezoelectric sub-layer 12b, the lattice constant $a(L2_X)$ and the lattice constant $b(L2_Y)$ being greater than the lattice constant $c(L2_Z)$. The in-plane directions of the second piezoelectric sub-layer 12b are parallel to the upper surface 10c of the lower electrode 10 as shown in FIG. 1. The lattice constant $a(L2_X)$ in a first direction (X-direction) that is one of the in-plane directions of the second piezoelectric sub-layer 12b is equal to or substantially equal to the lattice constant $b(L2_Y)$ in a second direction (Y-direction) which is one of the in-plane directions of the second piezoelectric sub-layer 12b and which is perpendicular to the first direction in the pseudocubic coordinate system. The relationship between these constants is represented by the following formula:

$$a(L2_X)=b(L2_Y)>c(L2_Z).$$

These prove that the inequality $L1_Z<L1_X$ holds for the first piezoelectric sub-layer 12a, wherein $L1_Z$ is a lattice constant in the thickness direction of the first piezoelectric sub-layer 12a and $L1_X$ is the maximum of lattice constants in in-plane directions of the first piezoelectric sub-layer 12a.

As is clear from the example below, it has been verified that lattice constants satisfy the above relationship when the first piezoelectric sub-layer 12a is made of lead titanate or a lead titanate solid solution. The polarization axis P1 of the first piezoelectric sub-layer 12a is directed in a direction in which a lattice constant is large, that is, in the X-direction in FIG. 2.

The inequality $L2_Z<L2_X$ holds for the second piezoelectric sub-layer 12b, wherein $L2_Z$ is a lattice constant in the thickness direction of the second piezoelectric sub-layer 12b and $L2_X$ is the maximum of lattice constants in in-plane directions of the second piezoelectric sub-layer 12b.

Figure 4:
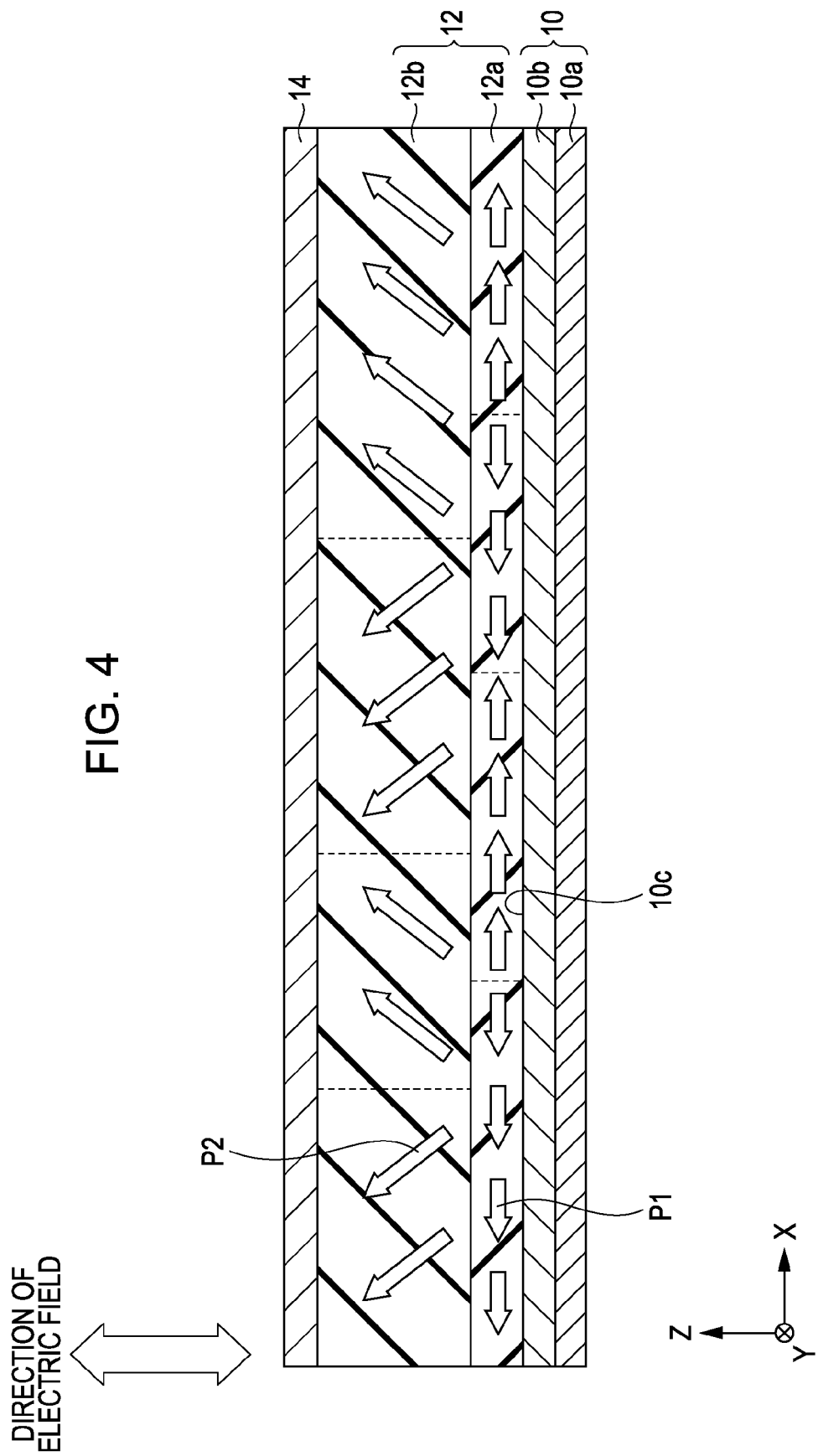
FIG. 4 is a schematic view illustrating the direction of a polarization axis of the first piezoelectric sub-layer and that of a polarization axis of the second piezoelectric sub-layer.

As is clear from the example below, it has been verified that lattice constants satisfy the above relationship when the second piezoelectric sub-layer 12b is made of lead zirconate titanate. The examination of crystal symmetry by Raman scattering and X-ray diffractometry has verified that lead zirconate titanate has a monoclinic structure. Thus, the second piezoelectric sub-layer 12b has an engineered domain configuration in which the polarization axis P2 is inclined to the thickness direction (the direction in which an electric field is applied) of the second piezoelectric sub-layer 12b at a finite angle as shown in FIG. 4.

The second piezoelectric sub-layer 12b has the monoclinic structure and is predominantly (100)-oriented in the pseudocubic coordinate system as described above. The second piezoelectric sub-layer 12b is formed on the first piezoelectric sub-layer 12a by deposition. The second piezoelectric sub-layer 12b is capable of having a large piezoelectric constant ($d_{31}$), as described below.

The monoclinic structure, which is one of perovskite-type structures represented by a pseudocubic crystal, has a larger compliance constant ($s_{kj}$) for shear-mode deformation as compared to other structures. The piezoelectric constant ($d_{ij}$) is given by the following equation using the compliance ($s_{kj}$) and the piezoelectric stress constant ($e_{ik}$);

$$d_{ij}=e_{ik}\cdot s_{kj}.$$

There is not much difference in piezoelectric stress constant ($e_{ik}$) between the monoclinic structure, a tetragonal structure, and a rhombohedral structure. The monoclinic structure has a significantly larger compliance constant ($s_{kj}$) as compared to other structures. Thus, the second piezoelectric sub-layer 12b, which has the monoclinic structure, probably has a high piezoelectric constant ($d_{31}$).

The direction of the polarization axis (polarization moment) of the piezoelectric layer 12 is described below with reference to FIGS. 1 to 4. FIG. 4 is a schematic view illustrating the direction of the polarization axis P1 of the first piezoelectric sub-layer 12a and that of the polarization axis P2 of the second piezoelectric sub-layer 12b.

With reference to FIG. 4, the polarization axis P1 of the first piezoelectric sub-layer 12a is in a plane following an in-plane direction of the first piezoelectric sub-layer 12a. FIG. 4 shows that the in-plane direction of the first piezoelectric sub-layer 12a is parallel to the upper surface 10c of the lower electrode 10. The term "plane following a direction parallel to the upper surface 10c of the lower electrode 10" as used herein covers not only planes following directions parallel to the upper surface 10c of the lower electrode 10 but also planes slightly inclined to such directions. Crystal grains are deposited such that the first piezoelectric sub-layer 12a forms an angle of, for example, zero to ten degrees with the lower electrode 10 of an underlayer (the lower electrode 10) because the first piezoelectric sub-layer 12a is affected by a material for forming the underlayer, the quality of the underlayer, and/or conditions for forming the underlayer as described below in detail. Therefore, a plane following a direction parallel to the upper surface 10c of the lower electrode 10 refers to a plane that forms an angle of zero to ten degrees with the lower electrode 10 of the lower electrode 10.

Since the polarization axis P1 of the first piezoelectric sub-layer 12a is in the plane that forms an angle of zero to ten degrees with the lower electrode 10 of the lower electrode 10, the inequality $\in x < \in z$ holds for the first piezoelectric sub-layer 12a, wherein $\in x$ is a dielectric constant in the direction of the polarization axis P1 and $\in z$ is a dielectric constant in the direction perpendicular to the polarization axis P1 in the pseudocubic coordinate system, that is, the direction (Z-direction) perpendicular to the upper surface 10c of the lower electrode 10. According to the Landolt-Bornstein database, it is known that the dielectric constant $\in$ of lead titanate with a tetragonal structure is least ($\in$=about 100) in the direction of the polarization axis (c-axis) thereof and is greatest ($\in$=about 200) in the direction perpendicular to the polarization axis thereof. Thus, when a polarization axis is parallel to an in-plane direction, an effective electric field applied to the first piezoelectric sub-layer 12a can be reduced and an effective electric field applied to the second piezoelectric sub-layer 12b can be increased.

Figure 5:
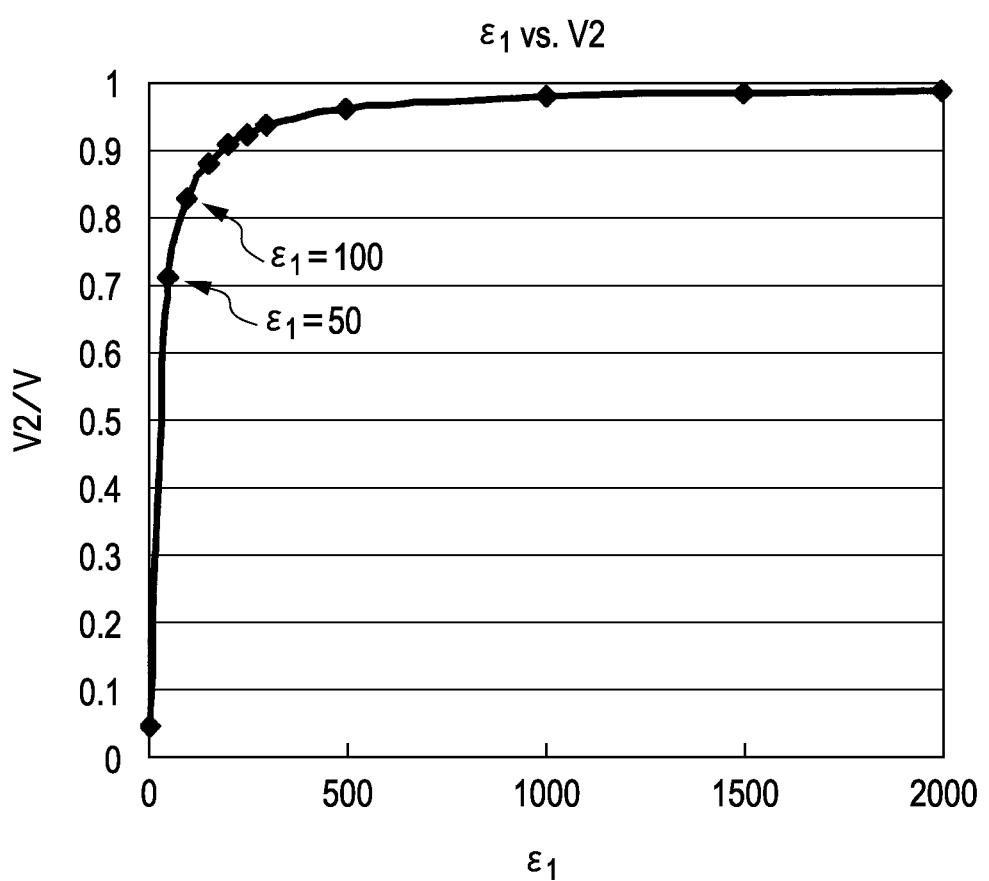
FIG. 5 is a graph showing the relationship between the dielectric constant of the first piezoelectric sub-layer and the voltage applied to the second piezoelectric sub-layer.

The relationship between the dielectric constant of the first piezoelectric sub-layer 12a and the voltage applied to the second piezoelectric sub-layer 12b is described below with reference to FIG. 5. In FIG. 5, the horizontal axis represents the dielectric constant $\in_1$ of the first piezoelectric sub-layer 12a and the vertical axis represents the ratio (V2/V) of the partial voltage V2 applied to the second piezoelectric sub-layer 12b to the voltage V applied to the whole of the piezoelectric layer 12.

The graph shown in FIG. 5 is determined by calculation as described below. In this example, the piezoelectric layer 12 is composed of a capacitor C1 that is the first piezoelectric sub-layer 12a and a capacitor C2 that is the second piezoelectric sub-layer 12b, the capacitor C1 and the capacitor C2 being connected to each other in series. The relationship between the dielectric constant $\in_1$ of the first piezoelectric sub-layer 12a and the partial voltage V2 applied to the second piezoelectric sub-layer 12b is determined by a known calculation method, when the thickness of the first piezoelectric sub-layer 12a is 10 nm, the dielectric constant $\in_2$ of the second piezoelectric sub-layer 12b is 2,000, and the thickness of the second piezoelectric sub-layer 12b is 1,000 nm.

FIG. 5 shows that an increase in the dielectric constant $\in_1$ of the first piezoelectric sub-layer 12a increases the partial voltage V2 applied to second piezoelectric sub-layer 12b. That is, when the dielectric constant $\in_1$ is large, a large partial voltage is applied to the thickest sub-layer (the second piezoelectric sub-layer 12b) in the piezoelectric layer 12 and therefore a large piezoelectric displacement can be expected.

The first piezoelectric sub-layer 12a is made of lead titanium ($PbTiO_3$) with a hexagonal structure. A larger dielectric constant $\in_2$ can be obtained by setting the c-axis (polarization axis) of $PbTiO_3$ in parallel to an in-plane direction as compared to the case where the c-axis (polarization axis) thereof is directed in the thickness direction perpendicular to the in-plane direction. Thus, a larger piezoelectric displacement can be obtained by setting the c-axis (polarization axis) of $PbTiO_3$ in parallel to the in-plane direction.

Figure 6:
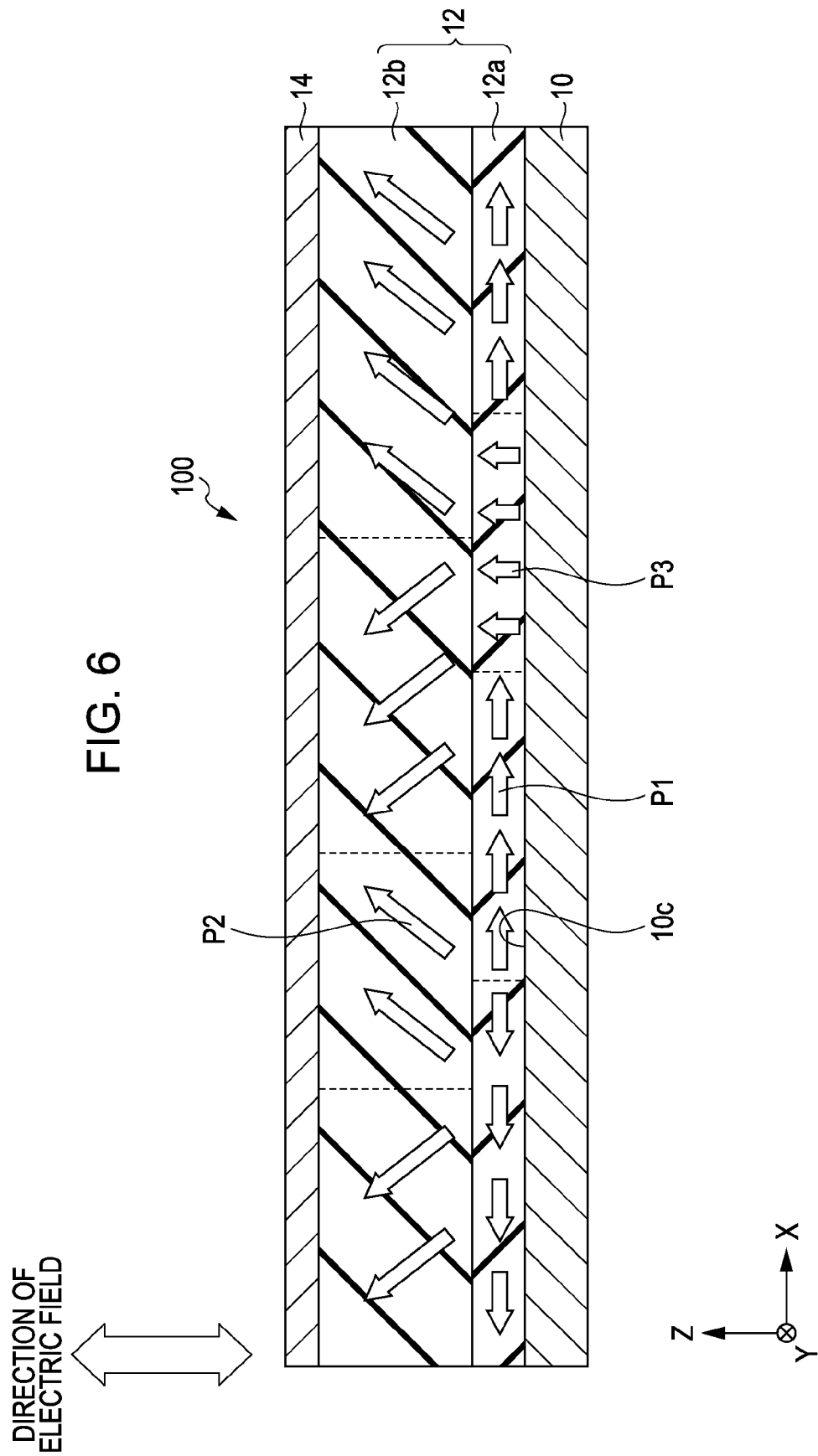
FIG. 6 is a schematic sectional view of a modification of the piezoelectric element.

FIG. 6 is a schematic sectional view of a modification of the piezoelectric element 100. In the modification, the polarization axis P1 of the first piezoelectric sub-layer 12a may include a polarization axis P3 that does not follow a direction parallel to the upper surface 10c of the lower electrode 10. In this embodiment, in all regions of the first piezoelectric sub-layer 12a, the polarization axis P1 preferably follows a direction parallel to the upper surface 10c of the lower electrode 10. The polarization axis P3 may be partly present depending on deposition conditions and/or the state of the underlayer (the lower electrode 10).

According to this embodiment, the polarization axis P1 of the first piezoelectric sub-layer 12a is predominantly directed along a plane parallel to an in-plane direction (which is parallel to the upper surface 10c of the lower electrode 10); hence, the effective voltage applied to the first piezoelectric sub-layer 12a can be substantially minimized and therefore the effective voltage applied to the second piezoelectric sub-layer 12b can be substantially maximized. This allows the second piezoelectric sub-layer 12b to have a large piezoelectric displacement.

If the polarization axis of the first piezoelectric sub-layer 12a is directed in an in-plane direction in a finite area of the plane area of the piezoelectric layer 12, a region thereof can be increased in piezoelectric displacement. If the polarization axis of the first piezoelectric sub-layer 12a is directed in an in-plane direction in 50% or more of the plane area of the piezoelectric layer 12, substantially the whole of the piezoelectric element 100 can be can be increased in piezoelectric displacement.

Since the second piezoelectric sub-layer 12b is deposited on the first piezoelectric sub-layer 12a, the second piezoelectric sub-layer 12b can be predominantly (100)-oriented in the pseudocubic coordinate system and is allowed to have the monoclinic structure. This allows the piezoelectric element 100 to have high piezoelectric properties.

An exemplary method for manufacturing the piezoelectric element 100 will now be described with reference to FIG. 1. In descriptions below, the following case is used as an example: the first piezoelectric sub-layer 12a is made of lead titanate and the second piezoelectric sub-layer 12b is made of lead zirconate titanate.

(1) A conductive layer used to form the lower electrode 10 is formed over the base 200. The base 200 is varied in structure depending on applications of the piezoelectric element 100 and therefore an example of the manufacture thereof is described below.

The conductive layer, which is used to form the lower electrode 10, is formed by, for example, sputtering. The conductive layer is not particularly limited and is preferably a laminate including a platinum sub-layer with a thickness of, for example, 20 nm to 150 nm and an iridium sub-layer which is disposed on the platinum sub-layer and which has a thickness of, for example, 10 nm to 60 nm. The iridium sub-layer may be converted into an oxide sub-layer by subsequent heat treatment.

In this step, the iridium sub-layer may be subjected to reverse sputtering for a short time, for example, 30 seconds at 100 W. This step may be shifted to subsequent Step (2) in a short time, for example, 30 seconds. Conditions for orienting the polarization of the first piezoelectric sub-layer 12a are sensitive to conditions for forming the lower electrode 10, which is an underlayer; hence, the iridium sub-layer is preferably processed as described above.

(2) A titanium layer is formed over the conductive layer by sputtering. The titanium layer may have a thickness of, for example, 0.5 nm to 12 nm in consideration of the thickness of the first piezoelectric sub-layer 12a. Titanium is converted into an oxide by heat treatment performed to crystallize the piezoelectric layer 12 and the oxide reacts with lead contained in the second piezoelectric sub-layer 12b to produce lead titanate. The layer of lead titanate may contain zirconium, which is contained in the second piezoelectric sub-layer 12b. Since lead and zirconium react with titanium by diffusion during heat treatment, a transition region in which the composition ratio of zirconium to titanium varies is present at the boundary between the first piezoelectric sub-layer 12a and the second piezoelectric sub-layer 12b. The first piezoelectric sub-layer 12a has B sites which are located on the lower electrode 10 side and which is rich in titanium. The composition ratio of zirconium to titanium in the first piezoelectric sub-layer 12a increases toward the second piezoelectric sub-layer 12b and approaches the composition ratio of zirconium to titanium in the second piezoelectric sub-layer 12b. Therefore, the first piezoelectric sub-layer 12a can be referred to as a solid solution prepared by doping lead titanate with zirconium.

The titanium layer preferably has a thickness of 1 nm to 20 nm in consideration of the transition region. When the thickness of the titanium layer is less than 1 nm, the thickness of the first piezoelectric sub-layer 12a is too small to control the orientation of the second piezoelectric sub-layer 12b. When the thickness of the titanium layer is greater than 20 nm, the thickness of the first piezoelectric sub-layer 12a is excessively large and therefore piezoelectric properties of the piezoelectric layer 12 are likely to be insufficient.

(3) A precursor of the second piezoelectric sub-layer 12b is then formed by, for example, a sol-gel process (solution process).

Metal compounds containing metals forming lead zirconate titanate (PZT) are mixed together such that the metals satisfy a desired molar ratio. The mixed metal compounds are dissolved in an organic solvent such as an alcohol, whereby a source solution is prepared. The source solution is applied over the titanium layer by a spin coating process or another process. The composition ratio (Zr:Ti) of Zr to Ti can be controlled by varying the mixing ratio of source solutions each containing a corresponding one of Zr and Ti in this solution. The source solutions may be mixed together such that Zr composition (Zr/(Zr+Ti)) is 0.5. Zr can be used at a ratio ranging from, for example, 0.45:1 to 0.55:1 with respect to the sum of Ti and Zr. Pb composition can be controlled by varying the mixing ratio of source solutions. In consideration of the volatilization of Pb by heat treatment, Pb can be used in an amount greater than a stoichiometric composition ratio.

Known compounds containing Pb, Zr, and Ti may be used. Usable metal compounds may be metal alkoxides, organic acid salts, and other compounds. Examples of carboxylates or acetylacetonato complexes containing metals forming PZT are those described below. An organometal containing lead (Pb) is, for example, lead acetate. An organometal containing zirconium (Zr) is, for example, zirconium butoxide. An organometal containing titanium (Ti) is, for example, titanium isopropoxide. Organometals containing metals forming PZT are not limited to those described above.

(4) The piezoelectric layer 12 precursor can be formed by performing heat treatment in a drying step and a degreasing step. The temperature of the drying step is preferably, for example, 150° C. to 200° C. The time of the drying step is preferably, for example, five minutes or more. In the degreasing step, organic components remaining in the dried piezoelectric layer 12 precursor can be removed by thermally decomposing the organic components into $NO_2$, $CO_2$, $H_2O$, and the like. The temperature of the degreasing step is, for example, about 300° C.

The precursor need not be formed in one batch and may be formed in several batches. In particular, the application, drying, and degreasing of a piezoelectric material may be repeated several times.

The precursor is then fired. In the firing step, the precursor can be crystallized by heating. The temperature of the firing step is preferably, for example, 650° C. to 800° C. The time of the firing step is preferably, for example, five to 30 minutes. Examples of an apparatus used in the firing step include, but are not limited to, diffusion furnaces and rapid thermal annealing (RTA) furnaces. Firing may be performed in each of the application, drying, and degreasing of the piezoelectric material.

The titanium layer is converted into a zirconium-containing lead titanate layer (the first piezoelectric sub-layer 12a) through the heat-treating step.

The first piezoelectric sub-layer 12a, which is made of lead titanate or the lead titanate solid solution, and the second piezoelectric sub-layer 12b, which is made of lead zirconate titanate or the lead zirconate titanate solid solution, can be formed through the above steps. Lead zirconate titanate used may be doped with an element such as Ca, La, or Nb.

(5) The upper electrode 14 is formed by, for example, sputtering.

(6) A columnar portion with a desired shape can be formed by patterning, for example, the upper electrode 14 and the piezoelectric layer 12. For example, the lower electrode 10 may be then patterned. For example, a lithographic technique and an etching technique can be used to pattern each layer. The lower electrode 10, the piezoelectric layer 12, and the upper electrode 14 may be patterned in the formation of each layer or patterned in the formation of a plurality of layers in one batch.

The piezoelectric element 100, which includes the base 200, the lower electrode 10, the piezoelectric layer 12, and the upper electrode 14, is formed through the above steps.

Second Embodiment

Figure 9:
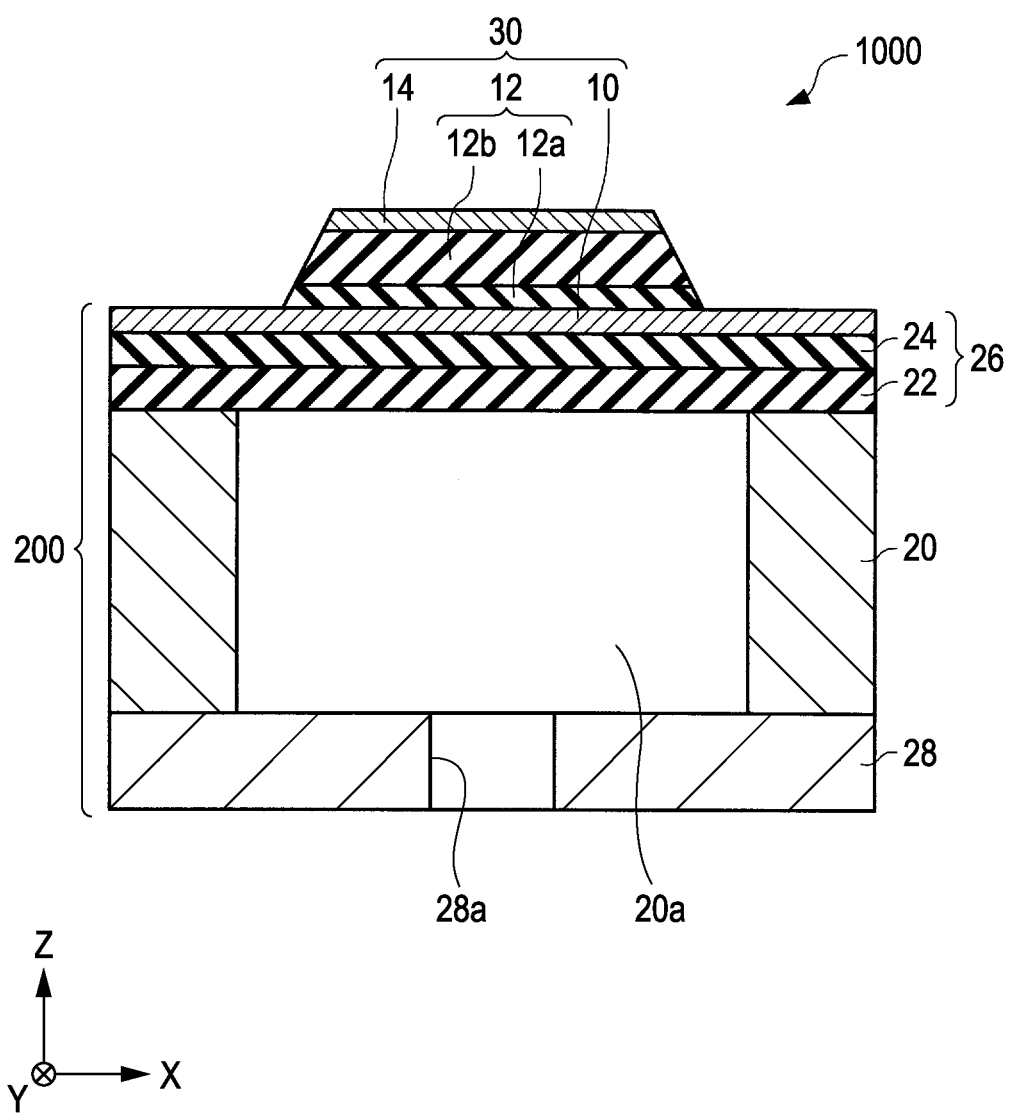
FIG. 9 is a schematic sectional view of a droplet-ejecting head according to a second embodiment of the present invention.
Figure 10:
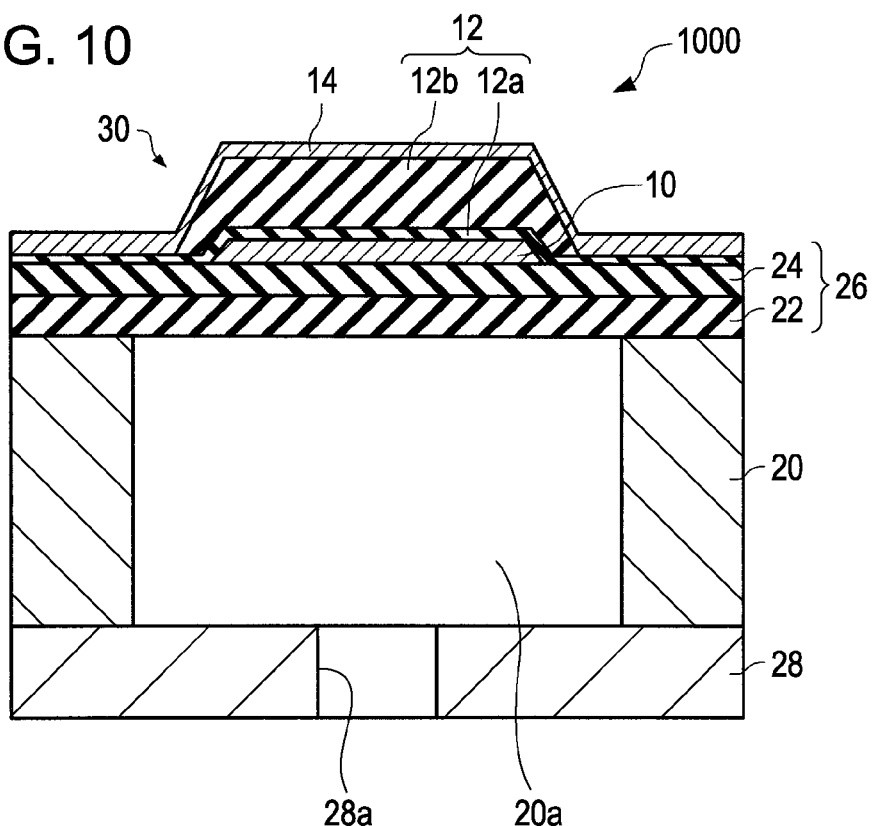
FIG. 10 is a schematic sectional view of a modification of the droplet-ejecting head.
Figure 11:
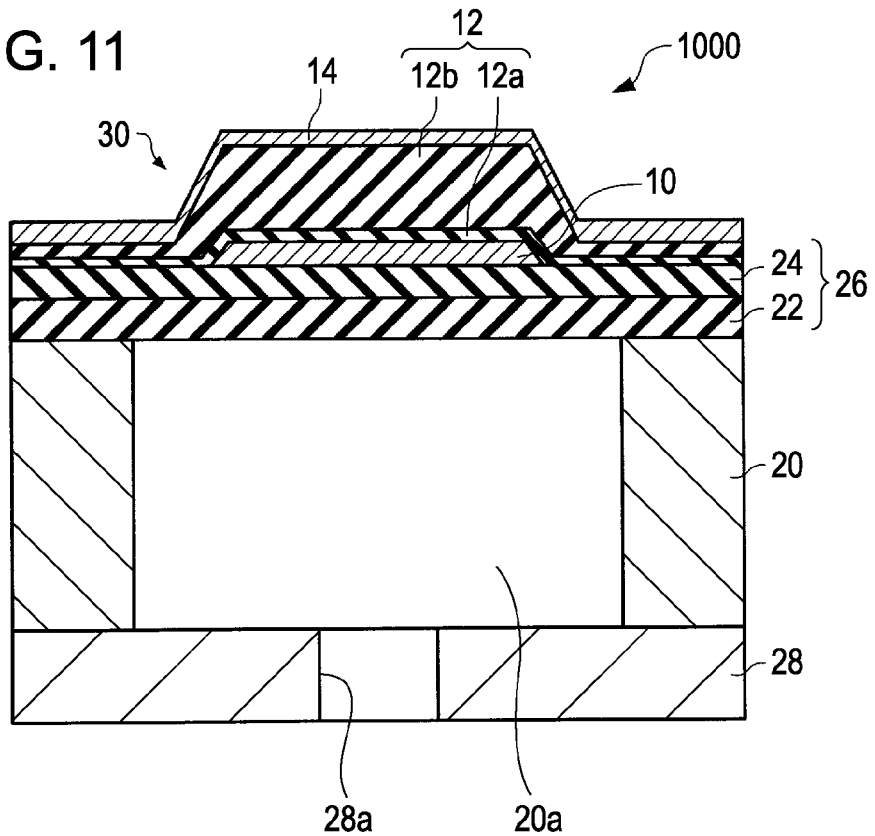
FIG. 11 is a schematic sectional view of a modification of the droplet-ejecting head.
Figure 12:
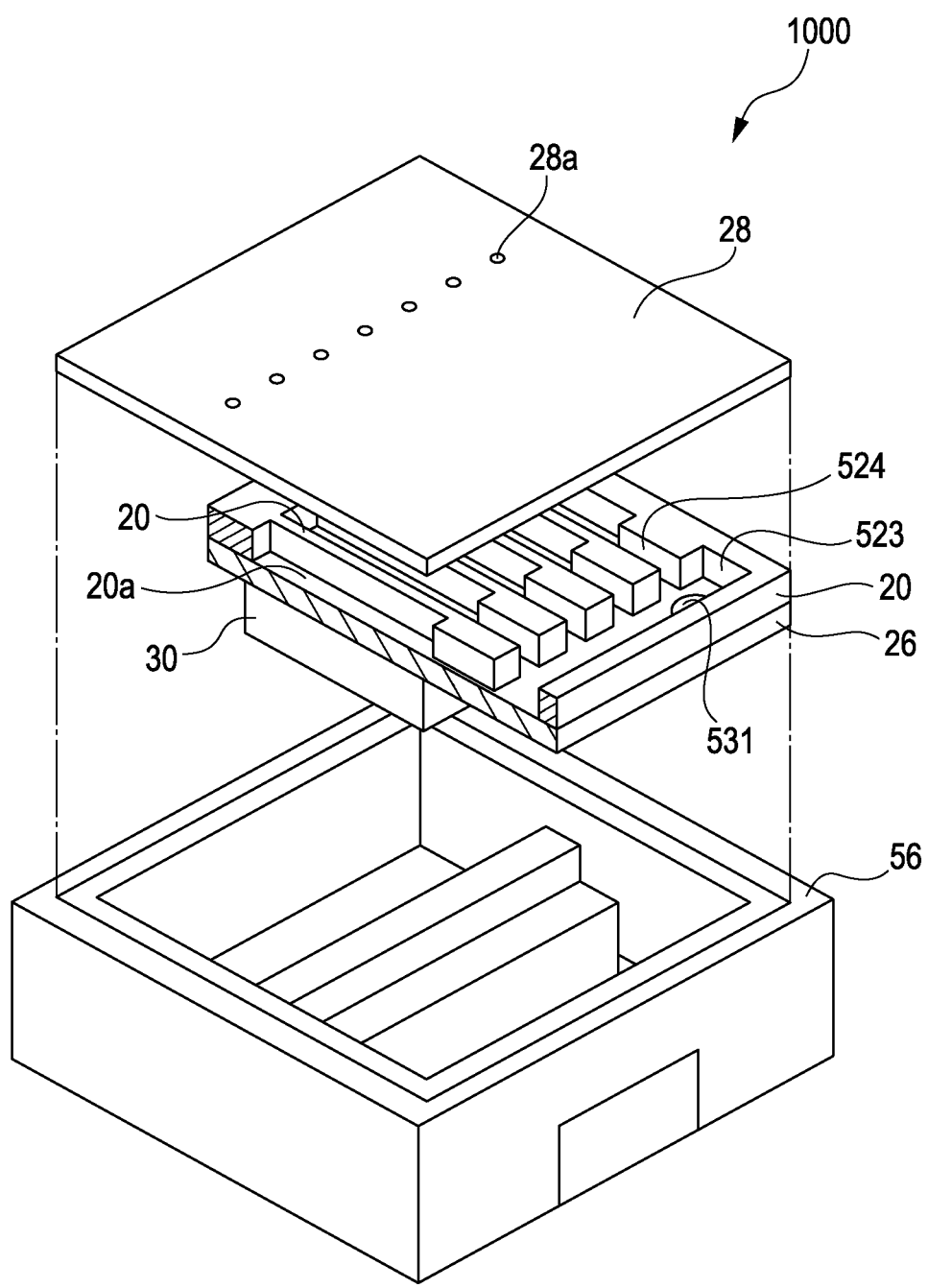
FIG. 12 is an exploded perspective view of the droplet-ejecting head.

FIG. 9 is a schematic sectional view of a droplet-ejecting head 1000 according to a second embodiment of the present invention. FIGS. 10 and 11 are schematic sectional views of modifications of the droplet-ejecting head 1000. FIG. 12 is an exploded perspective view of the droplet-ejecting head 1000, which is shown in an upside down manner. In FIG. 12, a driving portion 30 is simply shown.

The droplet-ejecting head 1000 includes the piezoelectric element 100 according to the first embodiment. In this embodiment, the base 200, which is included in the piezoelectric element 100, includes a pressure chamber-including substrate (hereinafter referred to as "pressure chamber substrate") 20, an elastic plate 26, a nozzle plate 28, and the driving portion 30. The driving portion 30 is disposed on the elastic plate 26.

The pressure chamber substrate 20 may be made of (110) single-crystalline silicon (<110> orientation). The pressure chamber substrate 20 includes pressure chambers 20a having openings.

The elastic plate 26 is disposed on the pressure chamber substrate 20. The elastic plate 26 may include, for example, an etching stopper layer 22 and an elastic layer 24 disposed on the etching stopper layer 22. The etching stopper layer 22 is made of, for example, silicon oxide ($SiO_2$). The etching stopper layer 22 has a thickness of, for example, 1 μm. The elastic layer 24 is made of, for example, zirconium oxide ($ZrO_2$). The elastic layer 24 has a thickness of, for example, 1 μm. The elastic plate 26 need not necessarily include the etching stopper layer 22, which is not shown.

The driving portion 30 is disposed on the elastic plate 26. The driving portion 30 can bend the elastic plate 26. The driving portion 30 includes the lower electrode 10, which is disposed on the elastic plate 26 (particularly on the elastic layer 24), the piezoelectric layer 12, which is disposed on the lower electrode 10, and the upper electrode 14, which is disposed on the piezoelectric layer 12. The piezoelectric layer 12 includes the first piezoelectric sub-layer 12a and the second piezoelectric sub-layer 12b. The lower electrode 10, the piezoelectric layer 12, and the upper electrode 14, which form the driving portion 30, have been described above with respect to the first embodiment and therefore will not be described again in detail.

In this embodiment, the piezoelectric layer 12 and the upper electrode 14, which are included in the driving portion 30, are arranged above the pressure chambers 20a. The lower electrode 10, which is included in the lower electrode 10, may extend on the pressure chamber substrate 20 to functions as a common electrode.

The nozzle plate 28 has nozzle holes 28a communicating with the pressure chambers 20a. Droplets of ink or the like are ejected through the nozzle holes 28a. In the nozzle plate 28, a large number of the nozzle holes 28a are arranged in a line. Examples of the nozzle plate 28 include rolled sheets made of stainless steel (SUS) and silicon substrates. The nozzle plate 28 is fixed under the pressure chamber substrate 20 (on the pressure chamber substrate 20 in FIG. 12) in a normal use mode. The droplet-ejecting head 1000 can be enclosed in a housing 56 as shown in FIG. 12. For example, various resin materials and metal materials can be used to form the housing 56.

With reference to FIG. 12, a reservoir (liquid storage portion) 523, supply ports 524, and a plurality of cavities (pressure chambers) 20a are arranged in a spaced which is located between the nozzle plate 28 and the elastic plate 26 and which is partitioned with the pressure chamber substrate 20. The elastic plate 26 has a through-hole 531 extending therethrough in the thickness direction thereof. The reservoir 523 temporarily stores a liquid or dispersion (hereinafter referred to as "ink"), such as ink, supplied from an external unit such as an ink cartridge through the through-hole 531. The ink is supplied to the cavities 20a through the supply ports 524.

Each of the cavities 20a is connected to a corresponding one of the nozzle holes 28a. The cavities 20a can be varied in volume by the distortion of the elastic plate 26. The variation in volume of the cavities 20a allows the ink to be ejected from the cavities 20a.

The driving portion 30 is electrically connected to a piezoelectric element-driving circuit (not shown) and can be operated (vibrated or distorted) in response to a signal transmitted from the piezoelectric element-driving circuit. The elastic plate 26 is distorted by the distortion of the driving portion 30, whereby the pressure in each cavity 20a can be rapidly increased.

Since the droplet-ejecting head 1000 includes the piezoelectric element 100, the droplet-ejecting head 1000 can increase the piezoelectric displacement of the piezoelectric layer 12 and has a good droplet-ejecting function. This feature applies to the modifications below.

FIGS. 10 and 11 are schematic sectional views of the modifications of the droplet-ejecting head 1000. Substantially the same members as those shown in FIG. 9 are denoted by the same reference numerals as those used in FIG. 9 and will not be described. Portions different from those of the droplet-ejecting head 1000 shown in FIG. 9 are mainly described below.

In the modification shown in FIG. 10, electrodes included in a driving portion 30 are different in configuration from those shown in FIG. 9. In particular, a lower electrode 10 and a second piezoelectric sub-layer 12b are located only above cavities (pressure chambers) 20a. A first piezoelectric sub-layer 12a and an upper electrode 14 extend out of these pressure chambers 20a in plan view. In the modification, this upper electrode 14 functions as a common electrode.

In the modification shown in FIG. 10, this first piezoelectric sub-layer 12a extends over an elastic layer 24. This allows this first piezoelectric sub-layer 12a, which serves as an orientation control layer, to be located in a region which is disposed under this second piezoelectric sub-layer 12b and which is wider than this second piezoelectric sub-layer 12b and also allows this second piezoelectric sub-layer 12b to have high crystallinity.

In the modification shown in FIG. 10, the presence of this first piezoelectric sub-layer 12a allows the natural frequency of a elastic plate 26 to be controllable.

In the modification shown in FIG. 11, electrodes included in a driving portion 30 are different in configuration from those shown in FIG. 9. In particular, a lower electrode 10 is located only above pressure chambers 20a. A first piezoelectric sub-layer 12a, a second piezoelectric sub-layer 12b, and an upper electrode 14 extend out of these pressure chambers 20a in plan view. In this modification, this upper electrode 14 can functions as a common electrode.

In the modification shown in FIG. 11, as well as the modification shown in FIG. 10, this first piezoelectric sub-layer 12a extends over an elastic layer 24. This allows this first piezoelectric sub-layer 12a, which serves as an orientation control layer, to be located in a region which is disposed under this second piezoelectric sub-layer 12b and which is wider than this second piezoelectric sub-layer 12b and also allows this second piezoelectric sub-layer 12b to have high crystallinity.

In the modification shown in FIG. 11, as well as the modification shown in FIG. 10, the presence of this first piezoelectric sub-layer 12a and this second piezoelectric sub-layer 12b allows the natural frequency of a elastic plate 26 to be controllable.

A method for manufacturing the droplet-ejecting head 1000 according to this embodiment will now be described with reference to FIG. 9.

(1) The elastic plate 26 is formed on, for example, a (110) single-crystalline silicon substrate. In particular, the etching stopper layer 22 and the elastic layer 24 are formed on the (110) single-crystalline silicon substrate in that order. This allows the elastic plate 26, which includes the etching stopper layer 22 and the elastic plate 26, to be formed. The etching stopper layer 22 can be formed by, for example, a thermal oxidation process. The elastic layer 24 can be formed by, for example, sputtering.

(2) The driving portion 30 is formed on the elastic plate 26. In particular, the lower electrode 10, the piezoelectric layer 12, and the upper electrode 14 are formed over the elastic plate 26 in that order. A procedure for forming the lower electrode 10, the piezoelectric layer 12, and the upper electrode 14, which are included in the driving portion 30, is the same as that described in the Formula and therefore is not described in detail.

(3) The pressure chambers 20a are formed by patterning the (100) single-crystalline silicon substrate, whereby the pressure chamber substrate 20 is obtained. For example, a lithographic technique and an etching technique can be used to pattern the (100) single-crystalline silicon substrate. The pressure chambers 20a are formed in such a manner that the (100) single-crystalline silicon substrate is partly etched such that, for example, the etching stopper layer 22 is exposed. In the etching step, the etching stopper layer 22 can function as an etching stopper. In the etching of the pressure chamber substrate 20, the etching rate of the etching stopper layer 22 is less than the etching rate of the pressure chamber substrate 20.

(4) The nozzle plate 28 is bonded to the lower end of the pressure chamber substrate 20. In this step, the nozzle holes 28a, which are arranged in the nozzle plate 28, are aligned with the pressure chambers 20a, which are arranged in the pressure chamber substrate 20, such that each of the nozzle holes 28a is connected to a corresponding one of the pressure chambers 20a.

The droplet-ejecting head 1000 is formed through the above steps.

In the modifications shown in FIGS. 10 and 11, the driving portions 30, the first piezoelectric sub-layers 12a, the second piezoelectric sub-layers 12b, and the upper electrodes 14, which are included in the driving portions 30, can be formed by known lithographic processes and etching processes as described above.

The droplet-ejecting head 1000 can be used as, for example, a ink jet recording head; a colorant-ejecting head used to manufacture a color filter for liquid crystal displays; an electrode material-ejecting head used to form an electrode for organic electroluminescent displays, field emission displays (FEDs), and other displays; and a bio-organic substance-ejecting head used to manufacture a bio-chip.

Third Embodiment

Figure 13:
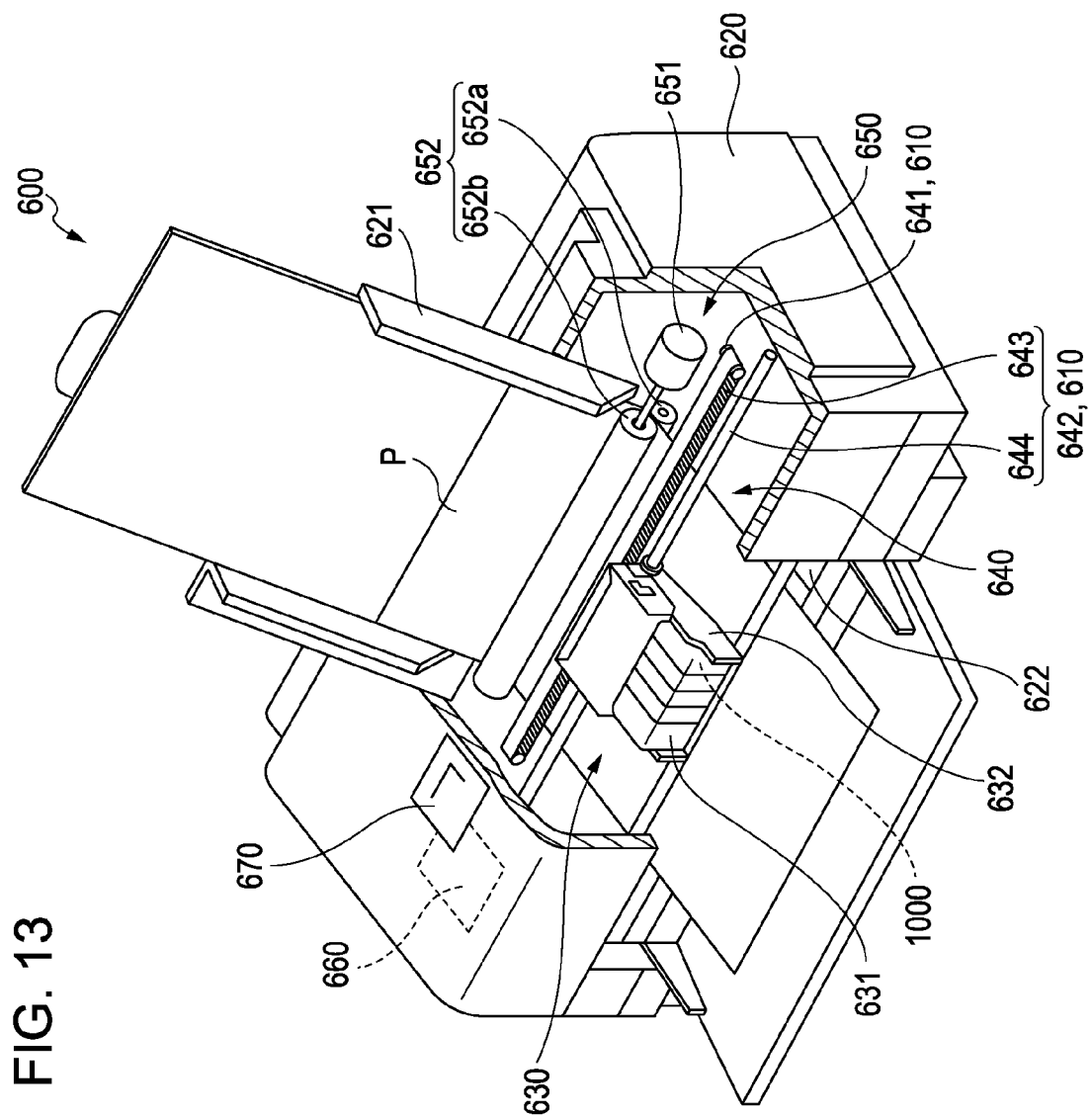
FIG. 13 is a schematic perspective view of a droplet-ejecting apparatus according to a third embodiment of the present invention.

A droplet-ejecting apparatus 600 according to a third embodiment of the present invention will now be described. The droplet-ejecting apparatus 600 includes the droplet-ejecting head 1000 according to the second embodiment and corresponds to an ink jet droplet-ejecting apparatus. FIG. 13 is a schematic perspective view of the droplet-ejecting apparatus 600.

The droplet-ejecting apparatus 600 includes a head unit 630, a head unit-driving section 610, and a control section 660. The droplet-ejecting apparatus 600 may further include an apparatus body 620, a sheet-feeding section 650, a tray 621 for carrying a recording sheet P, a discharge port 622 for discharging the recording sheet P, and an operating panel 670 disposed on the upper surface of the apparatus body 620.

The head unit 630 includes the droplet-ejecting head 1000. The head unit 630 further includes an ink cartridge 631 supplying ink to the droplet-ejecting head 1000 and a carrying section (carriage) 632 carrying the droplet-ejecting head 1000 and the ink cartridge 631.

The head unit-driving section 610 can reciprocate the head unit 630. The head unit-driving section 610 includes a carriage motor 641 serving as a driving source of the head unit 630 and a reciprocating mechanism 642 that receives torque from the carriage motor 641 to reciprocate the head unit 630.

The reciprocating mechanism 642 includes a carriage guide shaft 644 of which both ends are supported with a frame (not shown) and a timing belt 643 extending in parallel to the carriage guide shaft 644. The carriage guide shaft 644 supports the carriage 632 such that the carriage 632 can freely reciprocate. The carriage 632 is fixed to a portion of the timing belt 643. When the timing belt 643 is run by the operation of the carriage motor 641, the head unit 630 is guided with the carriage guide shaft 644 to reciprocate. Ink is appropriately ejected from the droplet-ejecting head 1000 during the reciprocation, whereby the recording sheet P is subjected to printing.

The control section 660 can control the head unit 630, the head unit-driving section 610, and the sheet-feeding section 650.

The sheet-feeding section 650 can transport the recording sheet P from the tray 621 to the head unit 630. The sheet-feeding section 650 includes a sheet-feeding motor 651 serving as a driving source thereof and a sheet-feeding roller 652 rotated by the operation of the sheet-feeding motor 651. The sheet-feeding roller 652 includes a driven sub-roller 652a and driving sub-roller 652b which are vertically arranged on opposite sides of the passage of the recording sheet P. The driving sub-roller 652b is connected to the sheet-feeding motor 651.

The head unit 630, the head unit-driving section 610, the control section 660, and the sheet-feeding section 650 are arranged in the apparatus body 620.

In this embodiment, the droplet-ejecting apparatus 600 has been described to be an ink jet droplet-ejecting apparatus. The droplet-ejecting apparatus 600 can be used as an industrial droplet-ejecting apparatus. Examples of a liquid (liquid material) ejected from the droplet-ejecting apparatus 600 include various functional materials and materials each having a viscosity appropriately adjusted with a dispersion medium.

EXAMPLE

A sample was prepared as described below. A silicon oxide layer with a thickness of 1000 nm and a zirconium oxide layer with a thickness of 500 nm were formed on a (110) single-crystalline silicon substrate in that order. The silicon oxide layer was formed by thermally oxidizing the silicon substrate. The zirconium oxide layer was formed in such a manner that a zirconium layer was formed by a sputtering process and was then thermally oxidized. A platinum layer was formed on the zirconium oxide layer by a sputtering process so as to have a thickness of 100 nm. An iridium layer was formed on the platinum layer by a sputtering process so as to have a thickness of 100 nm. A titanium layer was formed on the iridium layer by a sputtering process so as to have a thickness of 5 nm. A sol-gel source material for PZT was applied to the titanium layer by spin coating. The ratio of Pb to Zr to Ti contained in the sol-gel source material was 1.15:1:1.

A piezoelectric layer was formed as described below. A coating of the sol-gel source material was subjected to rapid thermal annealing (RTA) at 780° C. for 15 seconds in an oxygen atmosphere, whereby a PZT coating with a thickness of 200 nm was obtained. This operation was repeated five times, whereby a PZT layer with a thickness of about 1.0 μm was obtained. In this procedure, a lead titanate layer was formed under the PZT layer.

An iridium layer was formed on the PZT layer by a sputtering process so as to have a thickness of 200 nm. The sample was prepared as described above.

The sample was evaluated as described below. The PZT layer of the sample was subjected to X-ray diffraction, whereby the rocking curve of a PZT (200) peak was determined at θ-2θ. The rocking curve had a full width at half maximum of 21 degrees. This verified that the (100) orientation ratio of PZT was 90%.

Figure 7:
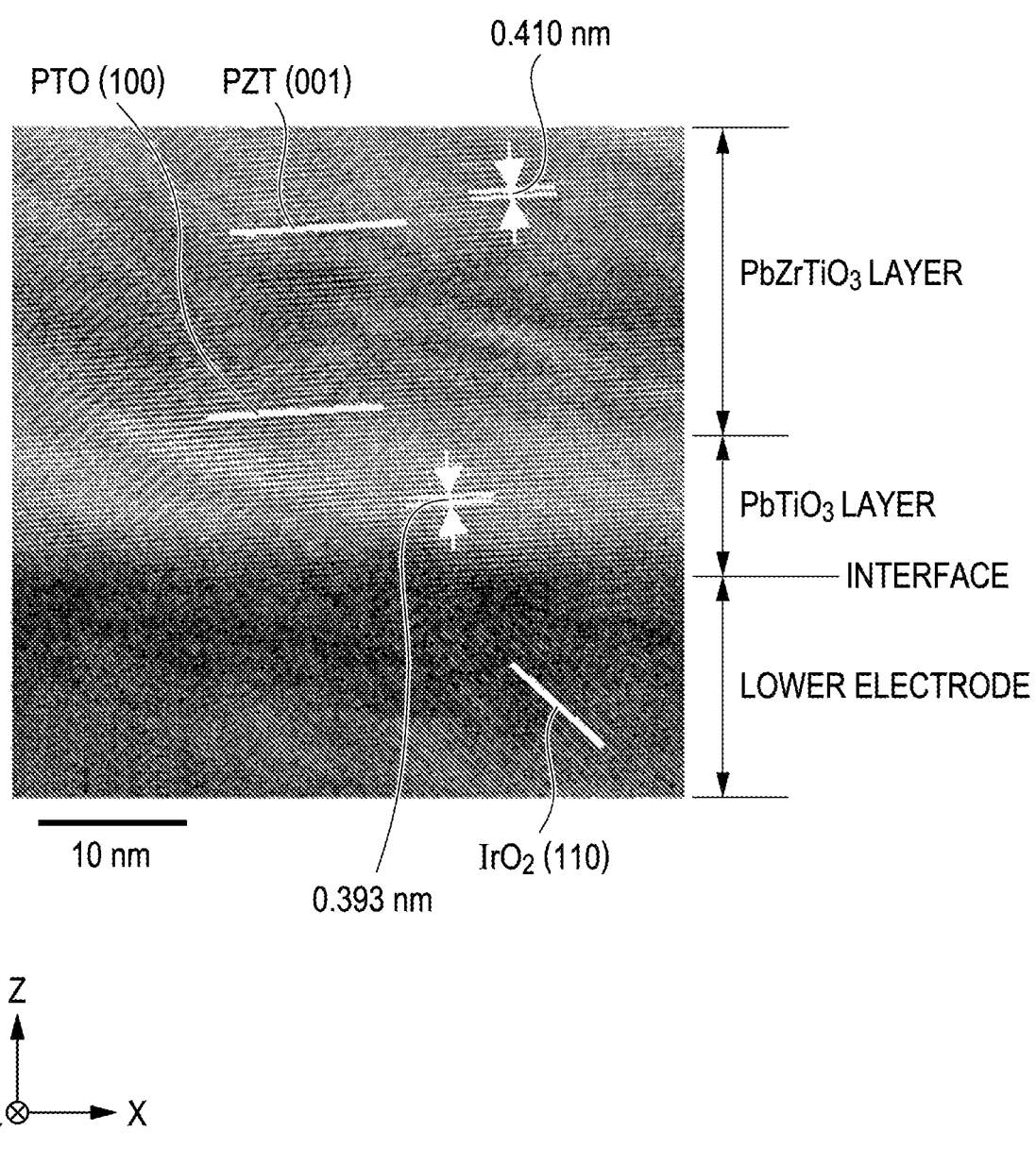
FIG. 7 is a TEM image of a piezoelectric layer formed in an example.

The piezoelectric layer of the sample was observed with a transmission electron microscope (TEM). FIG. 7 shows a TEM image of the piezoelectric layer. From FIG. 7, it was confirmed that the lead titanate layer (first piezoelectric sub-layer 12a) was disposed on a lower electrode, had a thickness of about 16 nm, and was inclined to the upper surface of the lower electrode (IrO$_2$) at an angle of about 3.2 degrees. The lead titanate layer had a lattice constant (L1$_Z$) of 0.393 nm in the thickness direction thereof. From the TEM image, the lattice constant of the lead titanate layer in an in-plane direction was determined to be 0.410 nm.

These show that the lead titanate layer has the largest lattice constant (L1$_X$) in an in-plane direction and also has a tetragonal structure having a polarization axis parallel to the lower electrode.

A lead zirconate titanate layer disposed on the lead titanate layer was measured for lattice constant by X-ray diffractometry. The lattice constants (L2$_X$ and L2$_Y$) thereof in the X-direction and the Y-direction were both 0.418 nm and the lattice constant (L2$_Z$) thereof in the Z-direction was 0.411 nm.

Figure 8:
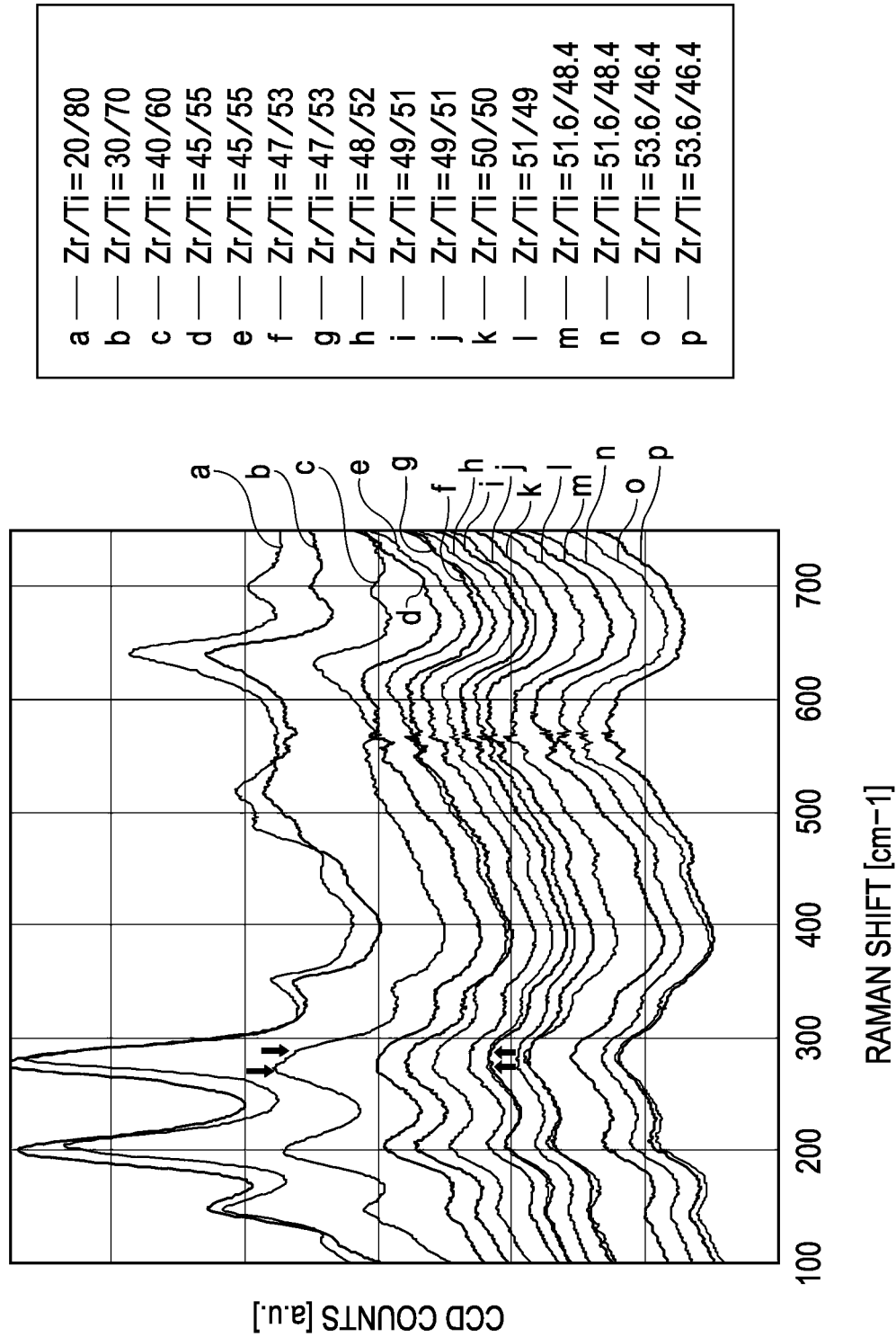
FIG. 8 is a graph showing results obtained by analyzing a sample by Raman scattering.

FIG. 8 shows results obtained by analyzing the sample by Raman scattering. Analysis conditions were as follows: an excitation laser beam wavelength of 514.5 nm, an analysis temperature of 4.2 K, an objective lens magnification of 50×, and an analysis temperature of 20 minutes. An analysis system used was a backscattering arrangement type.

Degeneracy or fragmentation occurs in natural resonance peaks located at a wavenumber (Raman shift) of 250-300 cm$^{-1}$ because of a reduction in crystal symmetry. This can be used to evaluate crystal symmetry. In particular, when lead zirconate titanate has a structure, having high crystal symmetry, such as a tetragonal or rhombohedral structure among perovskite-type structures, the peaks degenerate into one. When lead zirconate titanate has a structure, such as a monoclinic structure, having low crystal symmetry, each of the peaks fragments into two. Therefore, evaluation is performed by checking whether there is one peak or two peaks.

As shown in FIG. 8, the fragmentation of the natural resonance peaks is observed when the composition ratio (Zr/Ti) of Zr to Ti is 40/60 or more (c in the figure) and 50/50 or less (k in the figure).

This shows that the lead zirconate titanate layer has a monoclinic structure and an engineered domain configuration in which a polarization axis is inclined to the thickness direction thereof at a certain angle.

In the Raman spectrum shown in FIG. 8, no monoclinic structure cannot be confirmed when Zr exceeds 50. However, when the Zr/Ti composition ratio is 60/40, the fact that the inequality $L2_X > L2_Z$ holds is confirmed from analysis by X-ray diffraction. This proves that, in the composition, a second piezoelectric sub-layer 12b has monoclinic symmetry.

The present invention provides a technique commonly applicable to piezoelectric elements, such as pyroelectric sensors and ultrasonic sensors, having a capacitor structure.

While the embodiments of the present invention have been described above in detail, those skilled in the art can readily appreciate that various modifications can be made without departing from the spirit and scope of the present invention. Therefore, such modifications are within the scope of the present invention.

What is claimed is:

1. A droplet-ejecting head comprising:
   a pressure chamber communicating with a nozzle hole; and
   a piezoelectric element that includes a lower electrode, a piezoelectric layer which is formed above the lower electrode and which is made of perovskite-type oxide, and an upper electrode formed above the piezoelectric element,
   wherein the piezoelectric layer includes a first piezoelectric sub-layer located on a side of the lower electrode and a second piezoelectric sub-layer located between the first piezoelectric sub-layer and the upper electrode,
   wherein the first piezoelectric sub-layer has a polarization axis predominantly directed in an in-plane direction of the first piezoelectric sub-layer, and the second piezoelectric sub-layer is predominantly (100)-oriented in the pseudocubic coordinate system.

2. The droplet-ejecting head according to claim 1, wherein the second piezoelectric sub-layer has a monoclinic structure.

3. The droplet-ejecting head according to claim 1, wherein the first piezoelectric sub-layer has a tetragonal structure.

4. The droplet-ejecting head according to claim 1, wherein the second piezoelectric sub-layer is made of lead zirconate titanate.

5. The droplet-ejecting head according to claim 1, wherein the first piezoelectric sub-layer is made of lead titanate.

6. The droplet-ejecting head according to claim 5, wherein the first piezoelectric sub-layer contains zirconium.

7. The droplet-ejecting head according to claim 1, wherein the first piezoelectric sub-layer has a thickness of 1 nm to 20 nm.

8. The droplet-ejecting head according to claim 1, wherein the inequality $L1_Z < L1_X$ holds for the first piezoelectric sub-layer and the inequality $L2_Z < L2_X$ holds for the second piezoelectric sub-layer, where $L1_Z$ is a lattice constant in the thickness direction of the first piezoelectric sub-layer, $L1_X$ is the maximum of lattice constants in in-plane directions of the first piezoelectric sub-layer, $L2_Z$ is a lattice constant in the thickness direction of the second piezoelectric sub-layer, and $L2_X$ is the maximum of lattice constants in in-plane directions of the second piezoelectric sub-layer.

9. The droplet-ejecting head according to claim 1, wherein the inequality $\in x < \in z$ holds for the first piezoelectric sub-layer, where $\in x$ is a dielectric constant in the direction of the polarization axis and $\in z$ is a dielectric constant in the direction perpendicular to the polarization axis in the pseudocubic coordinate system.

10. A droplet-ejecting apparatus comprising the droplet-ejecting head according to claim 1.

11. A piezoelectric element comprising:
   a lower electrode;
   a piezoelectric layer which is formed above the lower electrode and which is made of perovskite-type oxide; and
   an upper electrode above the piezoelectric element,
   wherein the piezoelectric layer includes a first piezoelectric sub-layer located on a side of the lower electrode and a second piezoelectric sub-layer located between the first piezoelectric sub-layer and the upper electrode, the first piezoelectric sub-layer has a polarization axis predominantly directed in an in-plane direction of the first piezoelectric sub-layer, and the second piezoelectric sub-layer is predominantly (100)-oriented in the pseudocubic coordinate system.

12. A droplet-ejecting head comprising:
   a pressure chamber communicating with a nozzle hole; and
   a piezoelectric element that includes a lower electrode, a piezoelectric layer which is formed above the lower electrode and which is made of perovskite-type oxide, and an upper electrode formed above the piezoelectric element,
   wherein the piezoelectric layer includes a first piezoelectric sub-layer located on a side of the lower electrode and the piezoelectric layer also including a second piezoelectric sub-layer located between the first piezoelectric sub-layer and the upper electrode,
   wherein the first piezoelectric sub-layer has a polarization axis predominantly directed in an in-plane direction of the first piezoelectric sub-layer, having a tetragonal structure, and being composed of a lead titanate, and
   wherein the second piezoelectric sub-layer is predominantly (100)-oriented in the pseudocubic coordinate system and has a monoclinic structure and is comprised of a zirconate titanate.

13. The droplet-ejecting head according to claim 12, wherein the first piezoelectric sub-layer has a thickness of 1 nm to 20 nm.

14. The droplet-ejecting head according to claim 12, wherein the inequality $L1_Z < L1_X$ holds for the first piezoelectric sub-layer and the inequality $L2_Z < L2_X$ holds for the second piezoelectric sub-layer, where $L1_Z$ is a lattice constant in the thickness direction of the first piezoelectric sub-layer, $L1_X$ is the maximum of lattice constants in in-plane directions of the first piezoelectric sub-layer, $L2_Z$ is a lattice constant in the thickness direction of the second piezoelectric sub-layer, and $L2_X$ is the maximum of lattice constants in in-plane directions of the second piezoelectric sub-layer.

15. The droplet-ejecting head according to claim 12, wherein the inequality $\in x < \in z$ holds for the first piezoelectric sub-layer, where $\in x$ is a dielectric constant in the direction of the polarization axis and $\in z$ is a dielectric constant in the direction perpendicular to the polarization axis in the pseudocubic coordinate system.

16. A droplet-ejecting apparatus comprising the droplet-ejecting head according to claim 12.

* * * * *